(12) United States Patent
Kamimura

(10) Patent No.: US 11,843,326 B2
(45) Date of Patent: Dec. 12, 2023

(54) POWER CONVERTER

(71) Applicant: FUJI ELECTRIC CO., LTD., Kawasaki (JP)

(72) Inventor: Takeshi Kamimura, Okaya (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 59 days.

(21) Appl. No.: 17/562,474

(22) Filed: Dec. 27, 2021

(65) Prior Publication Data

US 2022/0255462 A1   Aug. 11, 2022

(30) Foreign Application Priority Data

Feb. 8, 2021   (JP) .................................. 2021-18163

(51) Int. Cl.
| | | |
|---|---|---|
| *H02M 1/08* | (2006.01) | |
| *H03K 17/08* | (2006.01) | |
| *H02M 1/32* | (2007.01) | |
| *H02M 7/5387* | (2007.01) | |
| *H02P 27/08* | (2006.01) | |

(52) U.S. Cl.
CPC ......... *H02M 7/53873* (2013.01); *H02M 1/08* (2013.01); *H03K 17/08* (2013.01); *H02M 1/327* (2021.05); *H02P 27/08* (2013.01); *H03K 2017/0806* (2013.01)

(58) Field of Classification Search
CPC . H02M 1/08; H02M 1/327; H03K 2017/0806
See application file for complete search history.

(56) References Cited

U.S. PATENT DOCUMENTS

| | | | |
|---|---|---|---|
| 6,628,491 B1* | 9/2003 | Tihanyi | H02H 5/04 |
| | | | 361/103 |
| 9,608,618 B2 | 3/2017 | Sakai et al. | |
| 2013/0060499 A1* | 3/2013 | Yoshimura | G01K 7/01 |
| | | | 702/99 |
| 2013/0229840 A1* | 9/2013 | Nakamori | H02M 1/32 |
| | | | 363/50 |
| 2015/0358013 A1 | 12/2015 | Sakai et al. | |
| 2016/0241242 A1* | 8/2016 | Toshiyuki | H03K 19/01806 |
| 2017/0077919 A1* | 3/2017 | Nakamori | H03K 17/0828 |
| 2018/0367023 A1* | 12/2018 | Terashima | H02M 1/08 |
| 2019/0131964 A1* | 5/2019 | Bryant | H03K 17/74 |
| 2019/0199195 A1* | 6/2019 | Akiyama | H03K 17/567 |
| 2019/0326898 A1* | 10/2019 | Taguchi | H02P 29/024 |

FOREIGN PATENT DOCUMENTS

| | | |
|---|---|---|
| JP | 2008533734 A | 8/2008 |
| WO | 2006097896 A1 | 9/2006 |
| WO | 2014123046 A1 | 8/2014 |

\* cited by examiner

*Primary Examiner* — Gary A Nash

(57) ABSTRACT

An object of the present invention is to provide a power converter capable of preventing upsizing of a chip on which a switching element is formed and detecting the temperature in a switching operation of the switching element. A power converter includes: an IGBT connected between an IGBT connected to the positive electrode side of a variable power supply and the negative electrode side of the variable power supply; a temperature detection resistor element connected to a gate to which a gate signal for controlling the switching operation of the IGBT is input and detecting the temperature of the IGBT; and a detector detecting the temperature level of the IGBT based on the voltage of the gate.

9 Claims, 6 Drawing Sheets

POWER CONVERTER

CROSS-REFERENCE TO RELATED APPLICATIONS

This application is based upon and claims the benefit of priority from the prior Japanese Patent Application No. 2021-18163, filed on Feb. 8, 2021, the entire contents of which are incorporated herein by reference.

FIELD OF THE INVENTION

The present invention relates to a power converter including a switching element.

DESCRIPTION OF THE RELATED ART

PTL 1 discloses a gate drive circuit driving a switching element as a semiconductor element for power conversion. The gate drive circuit disclosed in PTL 1 includes a temperature detection circuit detecting the temperature of the switching element. PTL 2 discloses a MOSFET having a temperature sensing function.

CITATION LIST

Patent Literatures

PTL 1: International Publication No. WO 2014/123046
PTL 2: International Publication No. WO 2006/097896

SUMMARY OF THE INVENTION

The technology disclosed in PTL 1 requires an output terminal of the temperature detection circuit arranged near the switching element. Therefore, the technology has a problem that the size of a chip on which the switching element is formed increases.

The technology disclosed in PTL 2 can detect the temperature in an off state of the MOSFET. However, this technology has a problem that the temperature in a switching operation of the MOSFET cannot be detected.

It is an object of the present invention to provide a power converter capable of preventing upsizing of a chip on which a switching element is formed and detecting the temperature in a switching operation of the switching element.

In order to achieve the above-described object, a power converter according to one aspect of the present invention includes: a second switching element connected between a first switching element connected to a positive electrode side of a power supply and a negative electrode side of the power supply; a temperature detection element connected to a control signal input terminal to which a control signal for controlling a switching operation of the second switching element is input and configured to detect the temperature of the second switching element; and a detection unit configured to detect the temperature level of the second switching element based on a voltage of the control signal input terminal.

According to one aspect of the present invention, the upsizing of a chip on which the switching element is formed can be prevented and the temperature in the switching operation of the switching element can be detected.

DESCRIPTION OF THE PREFERRED EMBODIMENTS

Embodiments of the present invention illustrate devices and methods for embodying the technical idea of the present invention. The technical idea of the present invention does not specify materials, shapes, structures, arrangement, and the like of constituent parts to the following embodiments. The technical idea of the present invention can be variously altered within the technical scope specified by Claims.

Hereinafter, an inverter device is described as an example of a power converter according to each embodiment, but the power converter according to these embodiments are not limited to the inverter device and is also applicable to a converter device, a modular multilevel converter, and the like.

First Embodiment (Overall Configuration of Power Converter)

A power converter according to a first embodiment of the present invention is described using FIG. 1 to FIG. 5. First, an example of the overall configuration of a power converter 1A according to this embodiment is described using FIG. 1.

Figure 1:
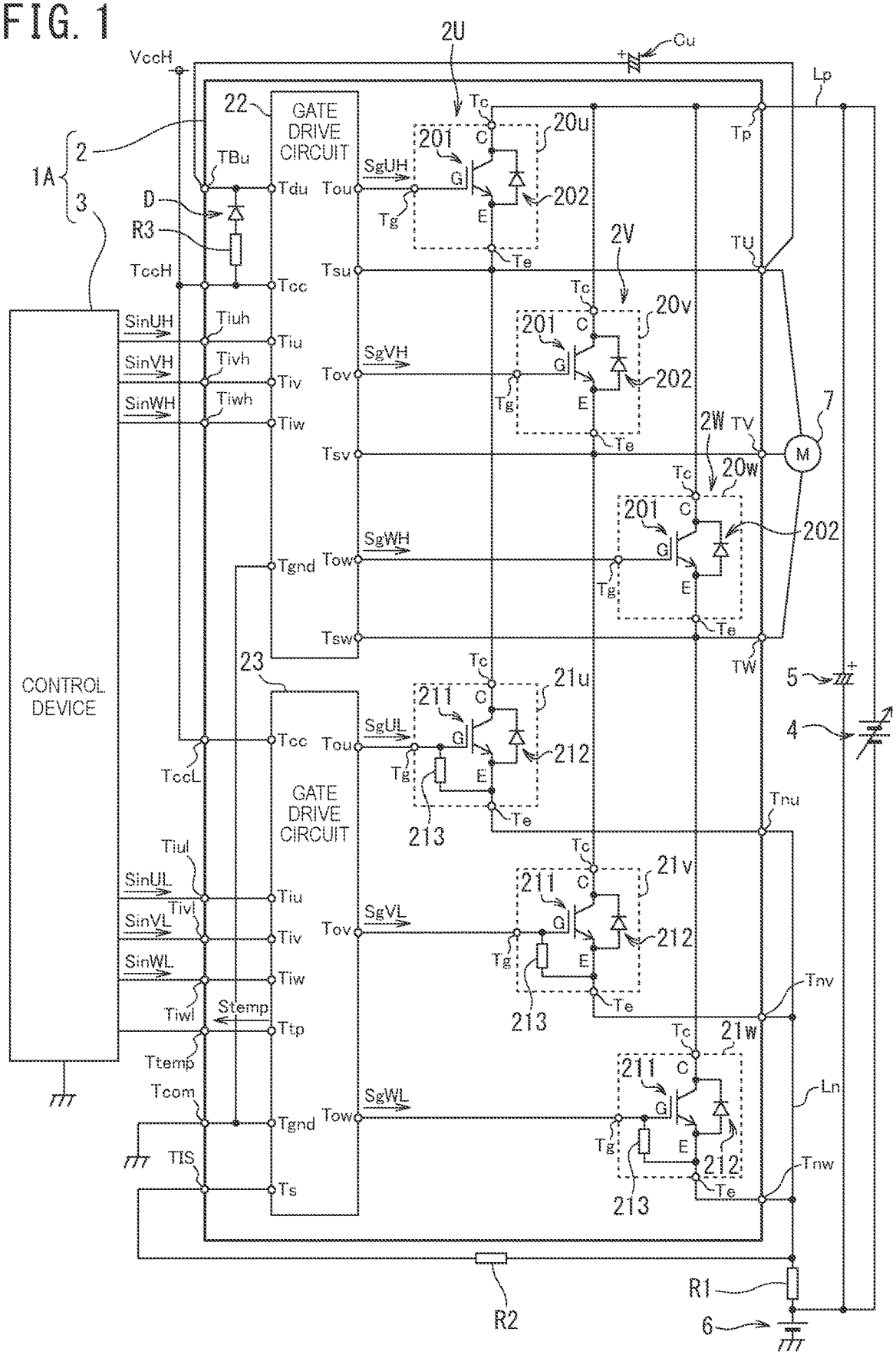
FIG. 1 is a circuit block diagram illustrating an example of the schematic configuration of a power converter according to a first embodiment of the present invention.

As illustrated in FIG. 1, the power converter 1A according to this embodiment is connected to a variable power supply 4. The variable power supply 4 has, for example, a three-phase AC power supply and a rectifier circuit full-wave rectifying three-phase AC power input from the three-phase AC power supply. The power converter 1A has a smoothing capacitor 5 smoothing power rectified by the rectifier circuit. Although not illustrated, the rectifier circuit is configured by full-bridge connecting six diodes or by full-bridge connecting six switching elements.

A positive electrode side line Lp is connected to a positive electrode side (i.e., a positive electrode output terminal of the rectifier circuit) of the variable power supply 4. A negative electrode side line Ln is connected to a negative electrode side (i.e., a negative electrode output terminal of the rectifier circuit) of the variable power supply 4. The negative electrode side line Ln is connected to the negative electrode side of the variable power supply 4 via a resistor element R1 provided in the power converter 1A. More specifically, one terminal of the resistor element R1 is connected to the negative electrode side line Ln and the other terminal of the resistor element R1 is connected to the negative electrode side of the variable power supply 4. The smoothing capacitor 5 is connected between the positive electrode side line Lp and the negative electrode side line Ln. The power converter 1A includes an inverter device 2 converting a DC voltage applied between the positive electrode side line Lp and the negative electrode side line Ln into a three-phase (U-phase, V-phase, and W-phase) AC voltage and a control device 3 controlling the inverter device 2. The inverter device 2 is configured by, for example, an Intelligent Power Module (IPM).

The inverter device 2 has a main power supply input terminal Tp to which the positive electrode side line Lp is connected. The inverter device 2 has a U-phase main power supply input terminal Tnu, a V-phase main power supply input terminal Tnv, and a W-phase main power supply input terminal Tnw connected to the negative electrode side line Ln. A U-phase output terminal TU is a terminal from which a U-phase AC voltage is output, the U-phase AC voltage being generated by DC-AC converting a DC voltage input from the variable power supply 4 by the inverter device 2. A V-phase output terminal TV is a terminal from which a V-phase AC voltage is output, the V-phase AC voltage being generated by DC-AC converting a DC voltage input from the variable power supply 4 by the inverter device 2. A W-phase output terminal TW is a terminal from which a W-phase AC voltage is output, the W-phase AC voltage being generated by DC-AC converting a DC voltage input from the variable power supply 4 by the inverter device 2.

As illustrated in FIG. 1, the inverter device 2 provided in the power converter 1A has insulated gate bipolar transistors 201 (one example of the first switching element) connected to the positive electrode side of the variable power supply (one example of the power supply) 4. The inverter device 2 has insulated gate bipolar transistors 211 (one example of the second switching element) connected between the insulated gate bipolar transistors 201 and the negative electrode side of the variable power supply 4. Hereinafter, the insulated gate bipolar transistor is abbreviated as "IGBT". In this embodiment, the first switching element is the IGBT 201 having a gate G as a control signal input terminal and the second switching element is the IGBT 211 having a gate G as a control signal input terminal.

The inverter device 2 has temperature detection resistor elements (one example of the temperature detection element) 213 connected to the gates G (one example of the control signal input terminal) to which gate signals SgUL, SgVL, SgWL (examples of the control signal, details are described later) for controlling switching operations of the IGBTs 211 are input and detecting the temperatures of the IGBTs 211. In this embodiment, the temperature detection element is a resistor element having one terminal connected to the gate G of the IGBT 211 and the other terminal connected to an emitter E of the IGBT 211. This eliminates the necessity of providing a terminal for connecting one terminal and the other terminal of the temperature detection resistor element 213 to a gate drive circuit 23 (details are described later) in each of semiconductor elements 21u, 21v, 21w. Therefore, the semiconductor elements 21u, 21v, 21w can be downsized. The inverter device 2 has a U-phase detection unit 234U, a V-phase detection unit 234V, and a W-phase detection unit 234W (examples of the detection unit, not illustrated in FIG. 1, see FIG. 2) each detecting the temperature level of the IGBT 211 based on the voltage of the gate G.

As illustrated in FIG. 1, the inverter device 2 has semiconductor elements 20u, 20v, 20w each having the IGBT 201 as a voltage-controlled semiconductor element, for example, constituting an upper arm portion connected to the positive electrode side line Lp. The inverter device 2 further has the semiconductor elements 21u, 21v, 21w each having the IGBT 211 constituting a lower arm portion connected to the negative electrode side line Ln.

The IGBT 201 provided in the semiconductor element 20u and the IGBT 211 provided in the semiconductor element 21v are connected in series between the positive electrode side line Lp and the negative electrode side line Ln to constitute a U-phase output arm 2U. The IGBT 201 provided in the semiconductor element 20v and the IGBT 211 provided in the semiconductor element 21v are connected in series between the positive electrode side line Lp and the negative electrode side line Ln to constitute a V-phase output arm 2V. The IGBT 201 provided in the semiconductor element 20w and the IGBT 211 provided in the semiconductor element 21w are connected in series between the positive electrode side line Lp and the negative electrode side line Ln to constitute a W-phase output arm 2W.

A reflux diode 202 is connected in anti-parallel to the IGBT 201 provided in each of the semiconductor elements 20u, 20v, 20w. The IGBT 201 and the reflux diode 202 provided in the semiconductor element 20u are formed on the same semiconductor chip. The IGBT 201 and the reflux diode 202 provided in the semiconductor element 20v are formed on the same semiconductor chip. The IGBT 201 and the reflux diode 202 provided in the semiconductor element 20w are formed on the same semiconductor chip. The IGBT 201 and the reflux diode 202 provided in each of the semiconductor elements 20u, 20v, 20w are formed on different semiconductor chips.

The semiconductor elements 20u, 20v, 20w each have a gate terminal Tg connected to the gate G of the IGBT 201, a collector terminal Tc connected to a collector C of the IGBT 201, and an emitter terminal Te connected to the emitter E of the IGBT 201. A cathode of the reflux diode 202 is connected to the collector terminal Tc. An anode of the reflux diode 202 is connected to the emitter terminal Te. The collector terminal Tc of each of the semiconductor elements 20u, 20v, 20w is connected to the main power supply input terminal Tp provided in the inverter device 2. Therefore, the collector C of the IGBT 201 and the cathode of the reflux diode 202 provided in each of the semiconductor elements 20u, 20v, 20w are connected to the main power supply input terminal Tp.

A reflux diode 212 is connected in anti-parallel to the IGBT 211 provided in each of the semiconductor elements 21u, 21v, 21w. The semiconductor elements 21u, 21v, 21w each have a temperature detection resistor element 213 connected between the gate G and the emitter E of the IGBT 211.

The reflux diode 212, the IGBT 211, and the temperature detection resistor element 213 provided in the semiconductor element 21u are formed on the same semiconductor chip. The reflux diode 212, the IGBT 211, and the temperature detection resistor element 213 provided in the semiconductor element 21v are formed on the same semiconductor chip. The reflux diode 212, the IGBT 211, and the temperature detection resistor element 213 provided in the semiconductor element 21w are formed on the same semiconductor chip. The reflux diode 212, the IGBT 211, and the temperature detection resistor element 213 provided in each of the semiconductor elements 21u, 21v, 21w are formed on different semiconductor chips. As described above, the formation of the IGBT 211, the temperature detection resistor element 213, and the reflux diode 212 on the same semiconductor chip enables the downsizing of the inverter device 2.

The semiconductor elements 21u, 21v, 21w each have a gate terminal Tg connected to the gate G of the IGBT 211, a collector terminal Tc connected to the collector C of the IGBT 211, and an emitter terminal Te connected to the emitter E of the IGBT 211. A cathode of the reflux diode 212 is connected to the collector terminal Tc. An anode of the reflux diode 212 is connected to the emitter terminal Te. One terminal of the temperature detection resistor element 213 is connected to the gate G and the gate terminal Tg of the IGBT 211. The other terminal of the temperature detection resistor element 213 is connected to the emitter E of the IGBT 211 and the cathode of the reflux diode 212 and the emitter terminal Te.

The emitter terminal Te of the semiconductor element 21u is connected to the U-phase main power supply input terminal Tnu provided in the inverter device 2. Therefore, the emitter E of the IGBT 211, the anode of the reflux diode 212, and the other terminal of the temperature detection resistor element 213 provided in the semiconductor element 21u are connected to the U-phase main power supply input terminal Tnu. The emitter terminal Te of the semiconductor element 21v is connected to the V-phase main power supply input terminal Tnv provided in the inverter device 2. Therefore, the emitter E of the IGBT 211, the anode of the reflux diode 212, and the other terminal of the temperature detection resistor element 213 provided in the semiconductor element 21v are connected to the V-phase main power supply input terminal Tnv. The emitter terminal Te of the semiconductor element 21w is connected to the W-phase main power supply input terminal Tnw provided in the inverter device 2. Therefore, the emitter E of the IGBT 211, the anode of the reflux diode 212, and the other terminal of the temperature detection resistor element 213 provided in the semiconductor element 21w are connected to the W-phase main power supply input terminal Tnw.

The emitter terminal Te of the semiconductor element 20u and the collector terminal Tc of the semiconductor element 21u are connected to each other and each are connected to the U-phase output terminal TU. The emitter terminal Te of the semiconductor element 20v and the collector terminal Tc of the semiconductor element 21v are connected to each other and each are connected to the V-phase output terminal TV. The emitter terminal Te of the semiconductor element 20w and the collector terminal Tc of the semiconductor element 21w are connected to each other and each are connected to the W-phase output terminal TW.

As illustrated in FIG. 1, a motor 7, for example, which serves as a load is connected to the U-phase output terminal TU, the V-phase output terminal TV, and the W-phase output terminal TW provided in the inverter device 2. Therefore, the emitter E of the IGBT 201 provided in each of the semiconductor elements 20u, 20v, 20w and the collector C of the IGBT 211 provided in each of the semiconductor elements 21u, 21v, 21w are connected to the motor 7.

The inverter device 2 is controlled by the control device 3 to perform switching operations of the IGBT 201 provided in each of the semiconductor elements 20u, 20v, 20w and the IGBT 211 provided in each of the semiconductor elements 21u, 21v, 21w. Thus, the inverter device 2 converts a DC voltage on the positive electrode side of the variable power supply 4 input from the main power supply input terminal Tp and DC voltages on the negative electrode side of the variable power supply 4 input from the U-phase main power supply input terminal Tnu, the V-phase main power supply input terminal Tnv, and the W-phase main power supply input terminal Tnw into an AC voltage to generate a three-phase AC voltage. The inverter device 2 outputs the U-phase AC voltage of the generated three-phase AC voltage to the motor 7 from the U-phase output terminal TU. The inverter device 2 outputs the V-phase AC voltage of the generated three-phase AC voltage to the motor 7 from the V-phase output terminal TV. The inverter device 2 outputs the W-phase AC voltage of the generated three-phase AC voltage to the motor 7 from the W-phase output terminal TW. Thus, the inverter device 2 can supply the three-phase AC power to the motor 7.

As illustrated in FIG. 1, the inverter device 2 has a signal input terminal Tiuh to which an input signal SinUH output by the control device 3 is input, an input signal input terminal Tivh to which an input signal SinVH output by the control device 3 is input, and a signal input terminal Tiwh to which an input signal SinWH output by the control device 3 is input. The inverter device 2 has a signal input terminal Tiul to which an input signal SinUL output by the control device 3 is input, a signal input terminal Tivl to which an input signal SinVL output by the control device 3 is input, and a signal input terminal Tiwl to which an input signal SinWL output by the control device 3 is input. The input signals SinUH, SinVH, SinWH are used to generate gate signals SgUH, SgVH, SgWH for driving the semiconductor elements 20u, 20v, 20w, respectively. The input signals SinUL, SinVL, SinWL are used to generate the gate signals SgUL, SgVL, SgWL for driving the semiconductor elements 21u, 21v, 21w, respectively.

As illustrated in FIG. 1, the power converter 1A includes a gate drive circuit 22 outputting the gate signals SgUH, SgVH, SgWH to the gate G of the IGBT 201 provided in each of the semiconductor elements 20u, 20v, 20w, respectively, and driving the IGBT 201. The power converter 1A further includes the gate drive circuit 23 (one example of the drive circuit) outputting the gate signals SgUL, SgVL, SgWL to the gate G of the IGBT 211 provided in each of the semiconductor elements 21u, 21v, 21w, respectively, and driving the IGBT 211. The gate drive circuits 22, 23 are provided in the inverter device 2. The gate drive circuit 22 individually controls the switching operations of the IGBTs 201 provided in the semiconductor elements 20u, 20v, 20w. The gate drive circuit 23 individually controls the switching operations of the IGBTs 211 provided in the semiconductor elements 21u, 21v, 21w.

The gate drive circuit 22 has an input terminal Tiu which is connected to the signal input terminal Tiuh and to which the input signal SinUH is input, an input terminal Tiv which is connected to the signal input terminal Tivh and to which the input signal SinVH is input, and an input terminal Tiw which is connected to the signal input terminal Tiwh and to which the input signal SinWH is input.

The gate drive circuit 22 has an output terminal Tou connected to the gate terminal Tg of the semiconductor element 20u. Although a detailed description is omitted, the gate drive circuit 22 outputs the gate signal SgUH switching on (conduction state) the IGBT 201 provided in the semiconductor element 20u from the output terminal Tou when the voltage level of the input signal SinUH input from the input terminal Tiu is low. On the other hand, the gate drive circuit 22 outputs the gate signal SgUH switching off (non-conduction state) the IGBT 201 provided in the semiconductor element 20u from the output terminal Tou when the voltage level of the input signal SinUH input from the input terminal Tiu is high. As described above, the gate drive circuit 22 outputs the gate signal SgUH for controlling the switching operation of the IGBT 201 provided in the semiconductor element 20u from the output terminal Tou.

The gate drive circuit 22 has an output terminal Tov connected to the gate terminal Tg of the semiconductor element 20v. Although a detailed description is omitted, the gate drive circuit 22 outputs the gate signal SgVH switching on (conduction state) the IGBT 201 provided in the semiconductor element 20v from the output terminal Tov when the voltage level of the input signal SinVH input from the input terminal Tiv is low. On the other hand, the gate drive circuit 22 outputs the gate signal SgVH switching off (non-conduction state) the IGBT 201 provided in the semiconductor element 20v from the output terminal Tov when the voltage level of the input signal SinVH input from the input terminal Tiv is high. As described above, the gate drive circuit 22 outputs the gate signal SgVH for controlling the switching operation of the IGBT 201 provided in the semiconductor element 20v from the output terminal Tov.

The gate drive circuit 22 has an output terminal Tow connected to the gate terminal Tg of the semiconductor element 20w. Although a detailed description is omitted, the gate drive circuit 22 outputs the gate signal SgWH switching on (conduction state) the IGBT 201 provided in the semiconductor element 20w from the output terminal Tow when the voltage level of the input signal SinWH input from the input terminal Tiw is low. On the other hand, the gate drive circuit 22 outputs the gate signal SgWH switching off (non-conduction state) the IGBT 201 provided in the semiconductor element 20w from the output terminal Tow when the voltage level of the input signal SinWH input from the input terminal Tiw is high. As described above, the gate drive circuit 22 outputs the gate signal SgWH for controlling the switching operation of the IGBT 201 provided in the semiconductor element 20w from the output terminal Tow.

As illustrated in FIG. 1, the gate drive circuit 22 has a power supply terminal Tcc to which a control power supply voltage VccH (voltage value of 15 V, for example) is input, the control power supply voltage VccH serving as a power supply of, for example, a circuit (not illustrated) generating the gate signals SgUH, SgVH, SgWH. The gate drive circuit 22 further has a power supply terminal Tdu to which a drive power supply voltage is input, the drive power supply voltage serving as a power supply of a driver circuit (not illustrated) provided in the circuit and driving the IGBT 201 of the semiconductor element 20u.

The gate drive circuit 22 has a low potential terminal Tsu connected to the U-phase output terminal TU provided in the inverter device 2. The low potential terminal Tsu is connected to the emitter terminal Te of the semiconductor element 20u. The low potential terminal Tsu is connected to the emitter E of the IGBT 201 and the anode of the reflux diode 202 provided in the semiconductor element 20u via the emitter terminal Te of the semiconductor element 20u. Thus, the potential on the negative electrode side of the driver circuit (not illustrated) driving the IGBT 201 provided in the semiconductor element 20u is equal to the potential on the low potential side (emitter E in this embodiment) of the IGBT 201 provided in the semiconductor element 20u via the low potential terminal Tsu and the emitter terminal Te of the semiconductor element 20u.

The gate drive circuit 22 has a low potential terminal Tsv connected to the V-phase output terminal TV provided in the inverter device 2. The low potential terminal Tsv is connected to the emitter terminal Te of the semiconductor element 20v. The low potential terminal Tsv is connected to the emitter E of the IGBT 201 and the anode of the reflux diode 202 provided in the semiconductor element 20v via the emitter terminal Te of the semiconductor element 20v. Thus, the potential on the negative electrode side of a driver circuit (not illustrated) driving the IGBT 201 provided in the semiconductor element 20v is equal to the potential on the low potential side (emitter E in this embodiment) of the IGBT 201 provided in the semiconductor element 20v via the low potential terminal Tsv and the emitter terminal Te of the semiconductor element 20v.

The gate drive circuit 22 has a low potential terminal Tsw connected to the W-phase output terminal TW provided in the inverter device 2. The low potential terminal Tsw is connected to the emitter terminal Te of the semiconductor element 20w. The low potential terminal Tsw is connected to the emitter E of the IGBT 201 and the anode of the reflux diode 202 provided in the semiconductor element 20w via the emitter terminal Te of the semiconductor element 20w. Thus, the potential on the negative electrode side of a driver circuit (not illustrated) driving the IGBT 201 provided in the semiconductor element 20w is equal to the potential on the low potential side (emitter E in this embodiment) of the IGBT 201 provided in the semiconductor element 20w via the low potential terminal Tsw and the emitter terminal Te of the semiconductor element 20w.

The inverter device 2 has a U-phase power supply terminal TBu to which a drive power supply voltage is input, the drive power supply voltage serving as a power supply of the driver circuit (not illustrated) driving the IGBT 201 provided in the semiconductor element 20u, and a control power supply terminal TccH to which the control power supply voltage VccH is input. The U-phase power supply terminal TBu is connected to the power supply terminal Tdu of the gate drive circuit 22. The control power supply terminal TccH is connected to the power supply terminal Tcc of the gate drive circuit 22.

The power converter 1A has a capacitor Cu connected between the U-phase power supply terminal TBu and the U-phase output terminal TU provided in the inverter device 2. One electrode of the capacitor Cu is connected to the U-phase power supply terminal TBu and the other electrode of the capacitor Cu is connected to the U-phase output terminal TU. The inverter device 2 has a resistor element R3 and a diode D connected in series between the power supply terminal Tcc and the power supply terminal Tdu. One terminal of the resistor element R3 is connected to the power supply terminal Tcc and the control power supply terminal TccH and the other terminal of the resistor element R3 is connected to an anode of the diode D. A cathode of the diode D is connected to the power supply terminal Tdu and the U-phase power supply terminal TBu. The diode D and the capacitor Cu constitute a bootstrap circuit. The bootstrap circuit can apply a voltage, which is obtained by adding a voltage on the positive electrode side of the variable power supply 4 to the control power supply voltage VccH, to the power supply terminal Tdu of the gate drive circuit 22. Thus, the gate drive circuit 22 can set the power supply of the driver circuit driving the IGBT 201 provided in the semiconductor element 20u to be higher than a voltage applied to the collector C of the IGBT 201.

Although not illustrated, the gate drive circuit 22 has a power supply terminal to which a drive power supply voltage is input, the drive power supply voltage serving as a power supply of a driver circuit (not illustrated) driving the IGBT 201 provided in each of the semiconductor elements 20v, 20w. Thus, the gate drive circuit 22 can set the power supply of the driver circuit driving the IGBT 201 provided in the semiconductor element 20v to be higher than a voltage applied to the collector C of the IGBT 201. Similarly, the gate drive circuit 22 can set the power supply of the driver circuit driving the IGBT 201 provided in the semiconductor element 20w to be higher than a voltage applied to the collector C of the IGBT 201.

The gate drive circuit 22 has a reference potential terminal Tgnd. The reference potential terminal Tgnd provided in the gate drive circuit 22 is a terminal for inputting a potential serving as the reference for the operation of, for example, the circuit generating the gate signals SgUH, SgVH, SgWH for controlling the switching operation of the IGBT 201 provided in each of the semiconductor elements 20u, 20v, 20w, respectively. The reference potential terminal Tgnd of the gate drive circuit 22 is connected to a common reference potential terminal Tcom provided in the inverter device 2.

As illustrated in FIG. 1, the gate drive circuit 23 has a reference potential terminal Tgnd. The reference potential terminal Tgnd provided in the gate drive circuit 23 is a terminal for inputting a potential serving as the reference for the operation of, for example, the circuit generating the gate signals SgUL, SgVL, SgWL for controlling the switching operation of the IGBT 211 provided in each of the semiconductor elements 21u, 21v, 21w, respectively. The reference potential terminal Tgnd of the gate drive circuit 23 is connected to the common reference potential terminal Tcom provided in the inverter device 2. The reference potential terminal Tgnd of the gate drive circuit 23 and the reference potential terminal Tgnd of the gate drive circuit 22 are connected to each other via the common reference potential terminal Tcom. The common reference potential terminal Tcom is connected (for example, grounded) to the reference plane of the potential in the power converter 1A.

The gate drive circuit 23 has an input terminal Tiu which is connected to a signal input terminal Tiul and to which an input signal SinUL output by the control device 3 is input, an input terminal Tiv which is connected to a signal input terminal Tivl and to which an input signal SinVL output by the control device 3 is input, and an input terminal Tiw which is connected to a signal input terminal Tiwl and to which an input signal SinWL output by the control device 3 is input.

The gate drive circuit 23 has an output terminal Tou connected to the gate terminal Tg of the semiconductor element 21u. Although details are described later, the gate drive circuit 23 outputs a gate signal SgUL switching on (conduction state) the IGBT 211 provided in the semiconductor element 21u from the output terminal Tou when the voltage level of the input signal SinUL input from the input terminal Tiu is low. On the other hand, the gate drive circuit 23 outputs the gate signal SgUL switching off (non-conduction state) the IGBT 211 provided in the semiconductor element 21u from the output terminal Tou when the voltage level of the input signal SinUL input from the input terminal Tiu is high. As described above, the gate drive circuit 23 outputs the gate signal SgUL for controlling the switching operation of the IGBT 211 provided in the semiconductor element 21u from the output terminal Tou.

The gate drive circuit 23 has an output terminal Toy connected to the gate terminal Tg of the semiconductor element 21v. Although details are described later, the gate drive circuit 23 outputs the gate signal SgVL switching on (conduction state) the IGBT 211 provided in the semiconductor element 21v from the output terminal Toy when the voltage level of the input signal SinVL input from the input terminal Tiv is low. On the other hand, the gate drive circuit 23 outputs the gate signal SgVL switching off (non-conduction state) the IGBT 211 provided in the semiconductor element 21v from the output terminal Tov when the voltage level of the input signal SinVL input from the input terminal Tiv is high. As described above, the gate drive circuit 23 outputs the gate signal SgVL for controlling the switching operation of the IGBT 211 provided in the semiconductor element 21v from the output terminal Tov.

The gate drive circuit 23 has an output terminal Tow connected to the gate terminal Tg of the semiconductor element 21w. Although a detailed description is omitted, the gate drive circuit 23 outputs the gate signal SgWL switching on (conduction state) the IGBT 211 provided in the semiconductor element 21w from the output terminal Tow when the voltage level of the input signal SinWL input from the input terminal Tiw is low. On the other hand, the gate drive circuit 23 outputs the gate signal SgWL switching off (non-conduction state) the IGBT 211 provided in the semiconductor element 21w from the output terminal Tow when the voltage level of the input signal SinWL input from the input terminal Tiw is high. As described above, the gate drive circuit 23 outputs the gate signal SgWL for controlling the switching operation of the IGBT 211 provided in the semiconductor element 21w from the output terminal Tow.

The gate terminal Tg of the semiconductor element 21u to which the gate signal SgUL is input and which is connected to the gate G of the IGBT 211 provided in the semiconductor element 21u is equivalent to the control signal input terminal. The gate terminal Tg of the semiconductor element 21v to which the gate signal SgVL is input and which is connected to the gate G of the IGBT 211 provided in the semiconductor element 21v is equivalent to the control signal input terminal. The gate terminal Tg of the semiconductor element 21w to which the gate signal SgWL is input and which is connected to the gate G of the IGBT 211 provided in the semiconductor element 21w is equivalent to the control signal input terminal.

As illustrated in FIG. 1, the gate drive circuit 23 has a power supply terminal Tcc to which a power supply of, for example, a circuit (not illustrated) generating the gate signals SgUL, SgVL, SgWL is input. The power supply terminal Tcc of the gate drive circuit 23 is connected to a control power supply terminal TccL provided in the inverter device 2. To the control power supply terminal TccL, the control power supply voltage VccH (voltage value of 15 V, for example) is input. Therefore, the control power supply voltage VccH is input as the power supply of, for example, the circuit (not illustrated) generating the gate signals SgUL, SgVL, SgWL to the gate drive circuit 23 via the control power supply terminal TccL and the power supply terminal Tcc.

As illustrated in FIG. 1, the gate drive circuit 23 has a detection signal output terminal Ttp from which a temperature detection signal Stemp based on the temperature levels of the IGBTs 211 detected by the U-phase detection unit 234U, the V-phase detection unit 234V, and the W-phase detection unit 234W (not illustrated in FIG. 1, see FIG. 2) is output. The inverter device 2 has a temperature output terminal Ttemp connected to the detection signal output terminal Ttp and the control device 3. This enables the inverter device 2 to output the temperature detection signal Stemp output from the detection signal output terminal Ttp of the gate drive circuit 23 to the control device 3 from the temperature output terminal Ttemp.

As illustrated in FIG. 1, the inverter device 2 has an overcurrent detection input terminal TIS. The overcurrent detection input terminal TIS is connected to the detection terminal Ts provided in the gate drive circuit 23 and one terminal of a resistor element R2 provided in the power converter 1A. The other terminal of the resistor element R2 is connected to one terminal of the resistor element R1 and the U-phase main power supply input terminal Tnu, the V-phase main power supply input terminal Tnv, and the W-phase main power supply input terminal Tnw provided in the inverter device 2.

Although not illustrated, the gate drive circuit 23 has an overcurrent protective circuit. The overcurrent protective circuit performs control to switch off the IGBT 211 when a current output from at least one of the U-phase main power supply input terminal Tnu, the V-phase main power supply input terminal Tnv, and the W-phase main power supply input terminal Tnw (i.e. a current flowing to the IGBT 211) has a current amount larger than a predetermined current amount and when a voltage input from the overcurrent detection input terminal TIS and the detection terminal Ts has a value larger than a predetermined value. This enables the gate drive circuit 23 to stop the flow of an overcurrent to at least one of the IGBTs 211 provided in the semiconductor elements 21u, 21v, 21w and prevent damage to the IGBT 211.

As illustrated in FIG. 1, the power converter 1A includes a constant voltage source 6 connected to the negative electrode side of the variable power supply 4 and the other terminal of the resistor element R1. The positive electrode side of the constant voltage source 6 is connected to the negative electrode side of the variable power supply 4 and the other terminal of the resistor element R1. The negative electrode side of the constant voltage source 6 is connected (e.g., grounded) to the reference plane of the potential in the power converter 1A. This enables the constant voltage source 6 to bias the emitter terminal Te in each of the semiconductor elements 21u, 21v, 21w at a predetermined constant voltage via the resistor element R1 and the negative electrode side line Ln, and the U-phase main power supply input terminal Tnu, the V-phase main power supply input terminal Tnv, and the W-phase main power supply input terminal Tnw, respectively.

As illustrated in FIG. 1, the control device 3 provided in the power converter 1A is connected (for example, grounded) to the reference plane of the potential in the power converter 1A. The control device 3 is configured to output the input signals SinUH, SinVH, SinWH of a pulse shape, for example, to the gate drive circuit 22 and output the input signals SinUL, SinVL, SinWL of a pulse shape, for example, to the gate drive circuit 23. This enables the control device 3 to control the gate drive circuits 22, 23 and control the IGBT 201 provided in each of the semiconductor elements 20u, 20v, 20w and the IGBT 211 provided in each of the semiconductor elements 21u, 21v, 21w by, for example, pulse width modulation (PWM).

(Configuration and Operation of Detection Unit Provided in Power Converter)

Figure 2:
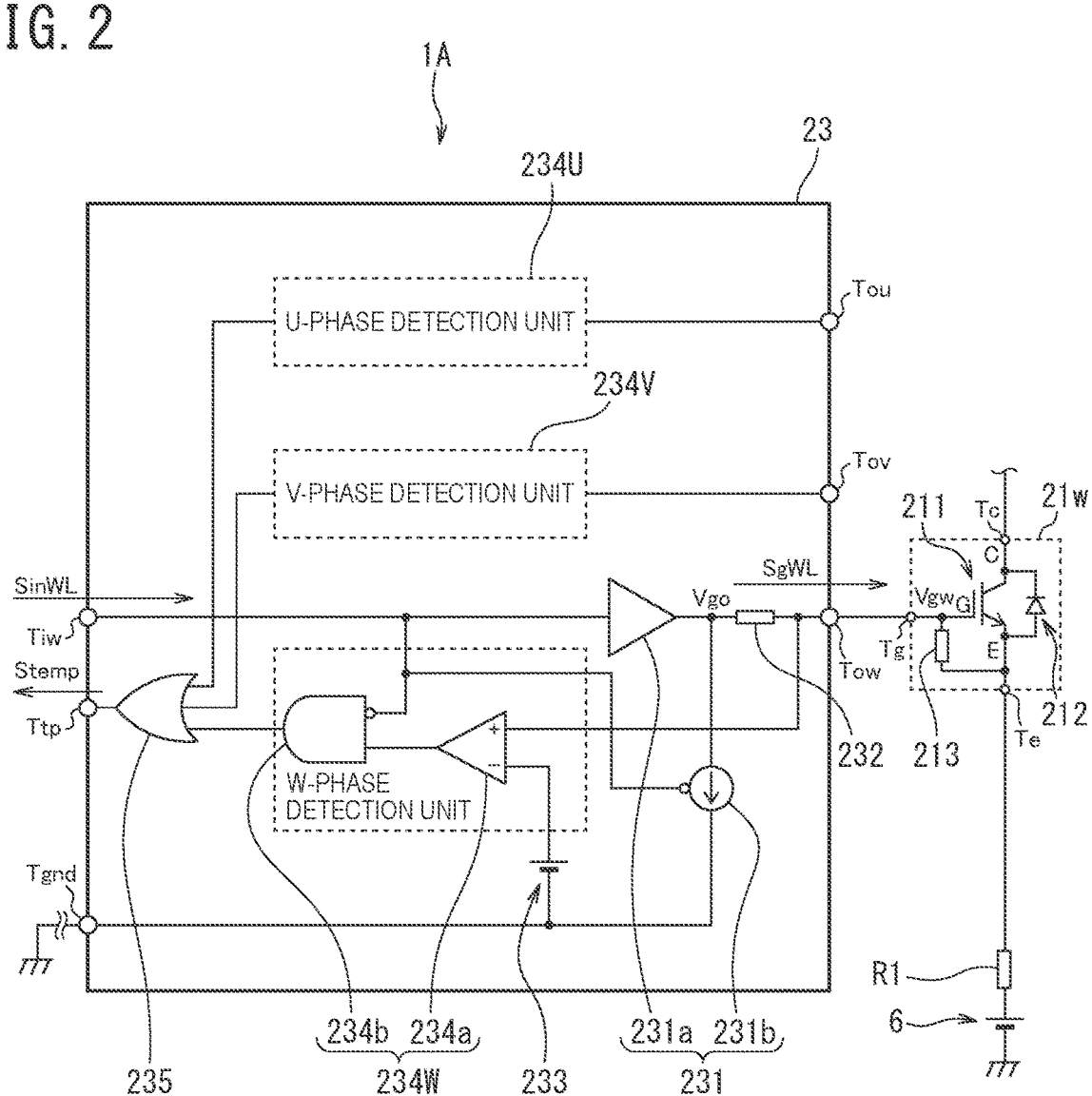
FIG. 2 is a diagram illustrating an example of a temperature detection circuit provided in the power converter according to the first embodiment of the present invention.
Figure 3:
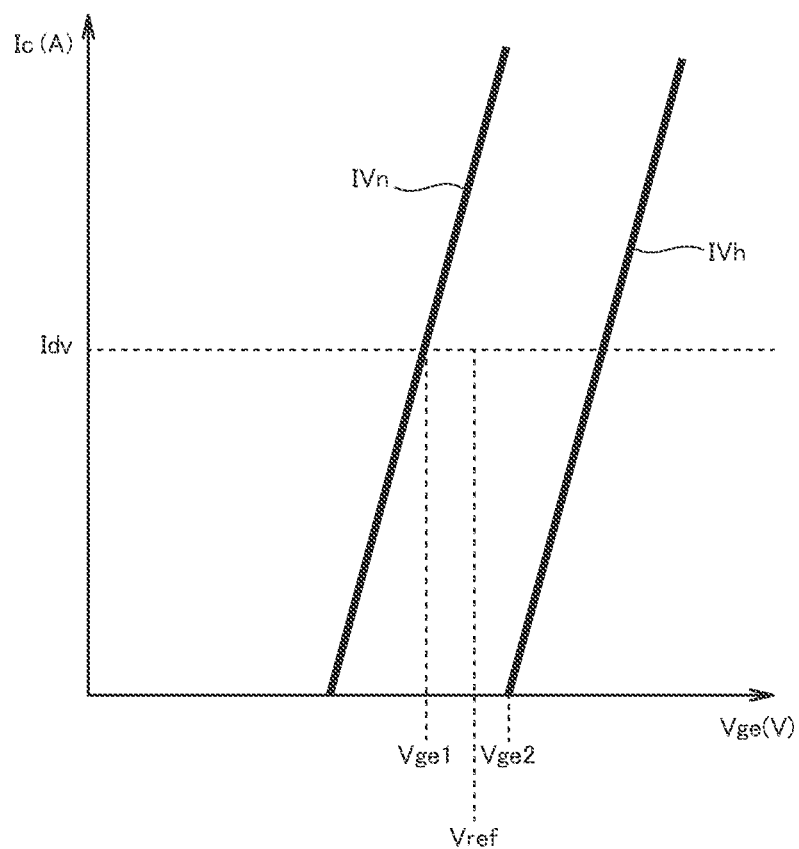
FIG. 3 is a diagram for explaining the temperature dependence of the current-voltage characteristics of a switching element provided in the power converter according to the first embodiment of the present invention.

Next, the configuration and the operation of the U-phase detection unit 234U, the V-phase detection unit 234V, and the W-phase detection unit 234W provided in the power converter 1A according to this embodiment are described using FIG. 2 and FIG. 3 with reference to FIG. 1. The U-phase detection unit 234U, the V-phase detection unit 234V, and the W-phase detection unit 234W have similar configurations. Therefore, the U-phase detection unit 234U, the V-phase detection unit 234V, and the W-phase detection unit 234W are described below taking the W-phase detection unit 234W as an example. For ease of understanding, FIG. 2 illustrates the semiconductor element 21w having the IGBT 211 as a temperature level detection target by the W-phase detection unit 234W and a driver circuit 231 driving the semiconductor element 21w. Further, for ease of understanding, FIG. 2 illustrates the U-phase detection unit 234U and the V-phase detection unit 234V (specific circuit configurations are not illustrated) and terminals relating to the detection of the temperature levels of the IGBTs 211.

As illustrated in FIG. 2, the gate drive circuit 23 has the driver circuit 231 to which the input signal SinWL output from the control device 3 (see FIG. 1) is input and one terminal of a gate resistor 232 arranged between the driver circuit 231 and the output terminal Tow of the gate drive circuit 23. The driver circuit 231 has a driver unit 231a connected to the input terminal Tiw of the gate drive circuit 23 and a constant current source 231b. An input terminal of the driver unit 231a is connected to the input terminal Tiw. An output terminal of the driver unit 231a is connected to the constant current source 231b and the gate resistor 232. The gate resistor 232 is provided to suppress a voltage fluctuation occurring in the switching operation of the IGBT 211 provided in the semiconductor element 21w. The driver unit 231a is configured to output the gate signal SgVL of a high level when the voltage level of the input terminal Tiw is low and the gate signal SgVL of a low level when the voltage level of the input terminal Tiw is high.

The constant current source 231b outputs a predetermined gate current to the gate terminal Tg of the semiconductor element 21w via the gate resistor 232 and the output terminal Tow when the voltage level of the input signal SinWL is low. Thus, the driver circuit 231 outputs the gate signal SgWL with a high voltage level to the gate G of the IGBT 211 provided in the semiconductor element 21w via the gate resistor 232, the output terminal Tow, and the gate terminal Tg of the semiconductor element 21w. Therefore, the gate signal SgWL applied to the gate G of the IGBT 211 provided in the semiconductor element 21w has a voltage lower by the voltage drop at the gate resistor 232 than the voltage of the gate signal SgWL output by the driver circuit 231.

On the other hand, when the voltage level of the input signal SinWL is high, the constant current source 231b does not output the gate current but releases an electric charge charged to the gate capacitance (not illustrated) of the IGBT 211 provided in the semiconductor element 21w to the reference potential terminal Tgnd. Thus, the driver circuit 231 drives the IGBT 211 such that a voltage Vgw of the gate G of the IGBT 211 provided in the semiconductor element 21w is lowered to almost the same level as the level of the voltage of the gate signal SgWL of a low level.

As described above, the driver circuit 231 transits the state of the IGBT 211 provided in the semiconductor element 21w from the off state (non-conduction state) to the on state (conduction state) (i.e., turn on) when the voltage level of the input signal SinWL input from the input terminal Tiw is low. On the other hand, the driver circuit 231 transits the state of the IGBT 211 provided in the semiconductor element 21w from the on state (conduction state) to the off state (non-conduction state) (i.e., turn off) when the voltage level of the input signal SinWL input from the input terminal Tiw is high.

Although not illustrated, the gate drive circuit 23 has a driver circuit having a configuration similar to the configuration of the driver circuit 231 and driving the IGBT 211 provided in the semiconductor element 21u and a driver circuit having a configuration similar to the configuration of the driver circuit 231 and driving the IGBT 211 provided in the semiconductor element 21v. Although not illustrated, the gate drive circuit 23 has a gate resistor provided between the driver circuit and the output terminal Tou and a gate resistor provided between the driver circuit and the output terminal Tov. The gate drive circuit 22 (see FIG. 1) further has a driver circuit having a configuration similar to the configuration of the driver circuit 231 and driving the IGBT 201 provided in each of the semiconductor elements 20u, 20v, 20w and a gate resistor provided between each of the driver circuits and each of the output terminals Tou, Tov, Tow in each of the semiconductor elements 20u, 20v, 20w, respectively.

As illustrated in FIG. 2, the gate drive circuit 23 has the W-phase detection unit 234W detecting the temperature level of the IGBT 211 based on the voltage of the gate G of the IGBT 211 provided in the semiconductor element 21w. Thus, the W-phase detection unit 234W is provided in the gate drive circuit 23. In addition to the W-phase detection unit 234W, the U-phase detection unit 234U and the V-phase detection unit 234V are also provided in the gate drive circuit 23. The formation of the U-phase detection unit 234U, the V-phase detection unit 234V, and the W-phase detection unit 234W in a semiconductor chip on which the gate drive circuit 23 is formed enables downsizing of the power converter 1A. The gate drive circuit 23 further has a voltage generation unit 233 generating a voltage for a comparison with the voltage of the gate G of the IGBT 211 provided in the semiconductor element 21w.

The W-phase detection unit 234W has a comparator 234a connected to the gate G of the IGBT 211 provided in the semiconductor element 21w and the voltage generation unit 233. The W-phase detection unit 234W further has a logical product (AND) gate 234b arithmetically operating the logical product of a signal output from the comparator 234a and the input signal SinWL input from the input terminal Tiw.

The voltage generation unit 233 contains, for example, a constant voltage source. The negative electrode side of the voltage generation unit 233 is connected to the reference potential terminal Tgnd provided in the gate drive circuit 23. The voltage generation unit 233 is configured to generate a comparison voltage Vref serving as the reference for the comparison in the comparator 234a. The comparison voltage Vref is set such that an overheat threshold level that the IGBT 211 provided in the semiconductor element 21w can cope with is detectable. The comparison voltage Vref is set to a voltage higher than a gate-emitter voltage Vge when the IGBT 211 provided in the semiconductor element 21w is operating within the range of the rated temperature.

The comparator 234a is, for example, a hysteresis comparator containing an operational amplifier and a resistor element which is not illustrated. A non-inverting input terminal (+) of the comparator 234a is connected to the other terminal of the gate resistor 232 and the output terminal Tow. The output terminal Tow is connected to the gate G of the IGBT 211 via the gate terminal Tg of the semiconductor element 21w. Therefore, the non-inverting input terminal (+) of the comparator 234a is connected to the gate G of the IGBT 211 provided in the semiconductor element 21w. An inverting input terminal (−) of the comparator 234a is connected to the positive electrode side of the voltage generation unit 233. An output terminal of the comparator 234a is connected to a positive logic input terminal of the AND gate 234b.

When the voltage Vgw of the gate G of the IGBT 211 provided in the semiconductor element 21w is equal to or smaller than the comparison voltage Vref generated by the voltage generation unit 233 (i.e., equal to or lower than the comparison voltage Vref), the comparator 234a outputs an output signal having a low voltage level to the AND gate 234b. When the voltage Vgw of the gate G of the IGBT 211 is higher than the comparison voltage Vref, the comparator 234a outputs an output signal having a high voltage level to the AND gate 234b.

Herein, the principle of the temperature detection of the IGBT 211 in the W-phase detection unit 234W is described using FIG. 2 and FIG. 3. FIG. 3 is a diagram schematically illustrating the current-voltage characteristics of the IGBT 211. The horizontal axis of the characteristics illustrated in FIG. 3 represents a gate-emitter voltage Vge (Unit: volt (V)) of the IGBT 211. The vertical axis of the characteristics illustrated in FIG. 3 represents a collector current Ic (Unit: ampere (A)) of the IGBT 211. "Vref" in FIG. 3 indicates the comparison voltage Vref generated by the voltage generation unit 233. "Idv" in FIG. 3 indicates the collector current (collector-emitter current) flowing to the IGBT 211 after the transition to the on state within the range of the rated temperature. "IVn" in FIG. 3 indicates the current-voltage characteristics of the IGBT 211 when operating within the range of the rated temperature. "IVh" in FIG. 3 indicates the current-voltage characteristics of the IGBT 211 when operating at a temperature higher than the rated temperature.

When the voltage of the gate signal SgWL output by the driver circuit 231 to switch on the IGBT 211 provided in the semiconductor element 21w is defined as Vgo, the voltage drop at the gate resistor 232 is defined as V232, the voltage drop at the resistor element R1 is defined as Vr1, and the output voltage of the constant voltage source 6 is defined as V6, Equation (1) below is established between these voltages and the gate-emitter voltage Vge of the IGBT 211.

$$Vgo = V232 + Vge + Vr1 + V6 \qquad (1)$$

When the voltage of the emitter E of the IGBT 211 provided in the semiconductor element 21w is defined as Vew and the voltage drop at the temperature detection resistor element 213 provided in the semiconductor element 21w is defined as V213, the gate-emitter voltage Vge of the IGBT 211 in the on state can be represented by Equation (2) below.

$$Vge = Vgw + V213 - Vew \qquad (2)$$

When the IGBT 211 is switched on, a gate current flowing from the gate terminal Tg of the semiconductor element 21w partially flows to the temperature detection resistor element 213, so that the voltage drop V213 occurs at the temperature detection resistor element 213.

In the temperature detection resistor element 213, the resistance value increases when the temperature becomes high, so that the voltage drop V213 increases. Therefore, as illustrated in Equation (2), the gate-emitter voltage Vge of the IGBT 211 increases when the temperature becomes high. More specifically, as illustrated in FIG. 3, the current-voltage characteristic IVh of the IGBT 211 when the temperature is higher than the rated temperature is shifted to a side where the gate-emitter voltage Vge is higher relative to the current-voltage characteristic IVh of the IGBT 211 when the temperature is within the range of the rated temperature.

The voltage Vgo of the gate signal SgWL output by the driver circuit 231 to switch on the IGBT 211 and the output voltage V6 of the constant voltage source 6 are constant irrespective of the temperature of the IGBT 211. Therefore, when the temperature of the IGBT 211 becomes higher than the rated temperature, the voltage drop V232 at the gate resistor 232, the gate-emitter voltage Vge of the IGBT 211, and the magnitude of the voltage drop Vr1 at the resistor element R1 change (see Equation (1)). As described above, the gate-emitter voltage Vge of the IGBT 211 increases when the temperature becomes high. Further, when the gate-emitter voltage Vge of the IGBT 211 increases, the collector current Ic flowing to the IGBT 211 increases, so that the voltage drop Vr1 at the resistor element R1 increases. Therefore, when the temperature of the IGBT 211 becomes higher than the rated temperature, the voltage drop V232 at the gate resistor 232 deceases. As a result, the voltage Vgw of the gate G of the IGBT 211 increases.

As illustrated in FIG. 3, the comparison voltage Vref generated by the voltage generation unit 233 is set to a voltage between the voltage Vgw of the gate G of the IGBT 211 when the gate-emitter voltage Vge of the IGBT 211 is a voltage Vge1 and the voltage Vgw of the gate G of the IGBT 211 when the gate-emitter voltage Vge of the IGBT 211 is a voltage Vge2. The voltage Vge1 has a voltage value of the gate-emitter voltage Vge required to pass the collector current Ic of the current Idv to the IGBT 211 within the range of the rated temperature. The voltage Vge2 has a voltage value of the gate-emitter voltage Vge where the collector current Ic starts to flow to the IGBT 211 at a temperature higher than the rated temperature.

When the comparison voltage Vref is set as described above, the voltage Vgw of the gate G of the IGBT 211 is lower than the comparison voltage Vref when the IGBT 211 performs the turn-on operation or maintains the on state within the range of the rated temperature (equal to or lower than the overheat threshold level). On the other hand, when the IGBT 211 performs the turn-on operation or maintains the on state at a temperature higher than the rated temperature (a state where the overheat threshold level is exceeded), the voltage Vgw of the gate G of the IGBT 211 is higher than the comparison voltage Vref. Therefore, when the IGBT 211 performs the turn-on operation or maintains the on state within the range of the rated temperature, a voltage input into the non-inverting input terminal (+) of the comparator 234a is lower than a voltage input into the inverting input terminal (−) of the comparator 234a, so that the comparator 234a outputs an output signal having a low voltage level to the AND gate 234b. On the other hand, when the IGBT 211 performs the turn-on operation or maintains the on state at a temperature higher than the rated temperature, a voltage input into the non-inverting input terminal (+) of the comparator 234a is higher than a voltage input into the inverting input terminal (−) of the comparator 234a, so that the comparator 234a outputs an output signal having a high voltage level to the AND gate 234b. As described above, the W-phase detection unit 234W is configured to detect the temperature level of the relevant IGBT 211 based on the level (high or low) of the voltage Vgw of the gate G of the IGBT 211 provided in the semiconductor element 21w with respect to the comparison voltage Vref input from the voltage generation unit 233 (one example of the outside). As described above, the power converter 1A can detect the temperature level of the IGBT 211 using the voltage of the gate G of the IGBT 211, and thus does not need to be provided with a terminal for acquiring a reverse bias voltage of the temperature detection resistor element 213. Thus, the power converter 1A can prevent upsizing of the semiconductor elements 21u, 21v, 21w, the gate drive circuit 23, and the power converter 1A itself.

As illustrated in FIG. 2, the AND gate 234b provided in the W-phase detection unit 234W has the positive logic input terminal and a negative logic input terminal. The positive logic input terminal of the AND gate 234b is connected to the output terminal of the comparator 234a. Therefore, an output signal output from the comparator 234a is input into the AND gate 234b without the signal level being logically inverted. The negative logic input terminal of the AND gate 234b is connected to the input terminal Tiw of the gate drive circuit 23. Therefore, the input signal SinWL input from the input terminal Tiw is input into the AND gate 234b with the signal level being logically inverted.

When the IGBT 211 provided in the semiconductor element 21w transits from the off state to the on state or operates while maintaining the on state within the range of the rated temperature, an output signal having a low voltage level is input into the positive logic input terminal of the AND gate 234b from the comparator 234a. When the IGBT 211 provided in the semiconductor element 21w transits from the off state to the on state or operates while maintaining the on state at a temperature higher than the rated temperature, an output signal having a high voltage level is input into the positive logic input terminal of the AND gate 234b from the comparator 234a. On the other hand, when the IGBT 211 provided in the semiconductor element 21w transits from the off state to the on state or operates while maintaining the on state within the range of the rated temperature, the voltage level of the input signal SinWL is low, and therefore the input signal SinWL of a high level is input into the AND gate 234b from the negative logic input terminal.

Therefore, the AND gate 234b outputs an output signal having a low voltage level when the IGBT 211 provided in the semiconductor element 21w transits from the off state to the on state or operates while maintaining the on state within the range of the rated temperature. On the other hand, the AND gate 234b outputs an output signal having a high voltage level when the IGBT 211 provided in the semiconductor element 21w transits from the off state to the on state or operates while maintaining the on state at a temperature higher than the rated temperature. The W-phase detection unit 234W outputs the output signal of the AND gate 234b as a detection signal for the temperature level of the IGBT 211 provided in the semiconductor element 21w.

When the IGBT 211 provided in the semiconductor element 21w transits from the on state to the off state or maintains the off state, the voltage level of the input signal SinWL input from the input terminal Tiw is high. In this case, the input signal SinWL of a low level is input into the AND gate 234b from the negative logic input terminal. Therefore, when the IGBT 211 provided in the semiconductor element 21w transits from the on state to the off state or maintains the off state, the AND gate 234b outputs a low level output signal irrespective of the voltage level of the output signal output from the comparator 234a.

Although a detailed description is omitted, the U-phase detection unit 234U detecting the temperature level of the IGBT 211 provided in the semiconductor element 21u and the V-phase detection unit 234V detecting the temperature level of the IGBT 211 provided in the semiconductor element 21v operate as with the W-phase detection unit 234W.

As illustrated in FIG. 2, the gate drive circuit 23 has a logical sum (OR) gate 235 arranged between the output terminal of each of the U-phase detection unit 234U, the V-phase detection unit 234V, and the W-phase detection unit 234W and the detection signal output terminal Ttp. One of three input terminals of the OR gate 235 is connected to the output terminal of the U-phase detection unit 234U. One of the remaining input terminals of the OR gate 235 is connected to the output terminal of the V-phase detection unit 234V and the other one of the remaining input terminals is connected to the output terminal of the W-phase detection unit 234W. An output terminal of the OR gate 235 is connected to the detection signal output terminal Ttp.

The OR gate 235 outputs a signal obtained by ORing the output signals output from the U-phase detection unit 234U, the V-phase detection unit 234V, and the W-phase detection unit 234W as the temperature detection signal Stemp.

When the IGBT 211 provided in each of the semiconductor elements 21u, 21v, 21w performs the turn-on operation or maintains the on state within the range of the rated temperature, output signals having a low voltage level are input into the OR gate 235 from the U-phase detection unit 234U, the V-phase detection unit 234V, and the W-phase detection unit 234W. In this case, the OR gate 235 outputs the temperature detection signal Stemp having a low voltage level to the control device 3 (see FIG. 1).

On the other hand, when at least one of the IGBTs 211 provided in the semiconductor elements 21u, 21v, 21w performs the turn-on operation or maintains the on state at a temperature higher than the rated temperature, output signals having a high voltage level are input into the OR gate 235 from the detection unit detecting the temperature level of the at least one of the IGBTs 211 of the U-phase detection unit 234U, the V-phase detection unit 234V, and the W-phase detection unit 234W. In this case, the OR gate 235 outputs the temperature detection signal Stemp having a high voltage level to the control device 3.

When the IGBT 211 provided in each of the semiconductor elements 21u, 21v, 21w performs the turn-off operation or is in the off state, output signals having a low voltage level are input into the OR gate 235 from the U-phase detection unit 234U, the V-phase detection unit 234V, and the W-phase detection unit 234W. In this case, the OR gate 235 outputs the temperature detection signal Stemp having a low voltage level to the control device 3 (see FIG. 1).

As described above, the gate drive circuit 23 can detect that any of the IGBTs 211 provided in the semiconductor elements 21u, 21v, 21w has a temperature level higher than the temperature level of the rated temperature. When the voltage level of the temperature detection signal Stemp input from the gate drive circuit 23 is high, the control device 3 controls the gate drive circuits 22, 23 so as to stop the switching operation of the IGBT 201 provided in each of the semiconductor elements 20u, 20v, 20w and the IGBT 211 provided in each of the semiconductor elements 21u, 21v, 21w. Thus, the overheat state of the IGBT 211 at a temperature level higher than the temperature level of the rated temperature among the IGBTs 211 provided in the semiconductor elements 21u, 21v, 21w is stopped. Therefore, the power converter 1A can prevent damage of the IGBT 211 at a temperature level higher than the temperature level of the rated temperature and damage due to, for example, an overcurrent in another IGBT 211 resulting from the damage of the IGBT 211.

(Effects of Power Converter)

Figure 4:
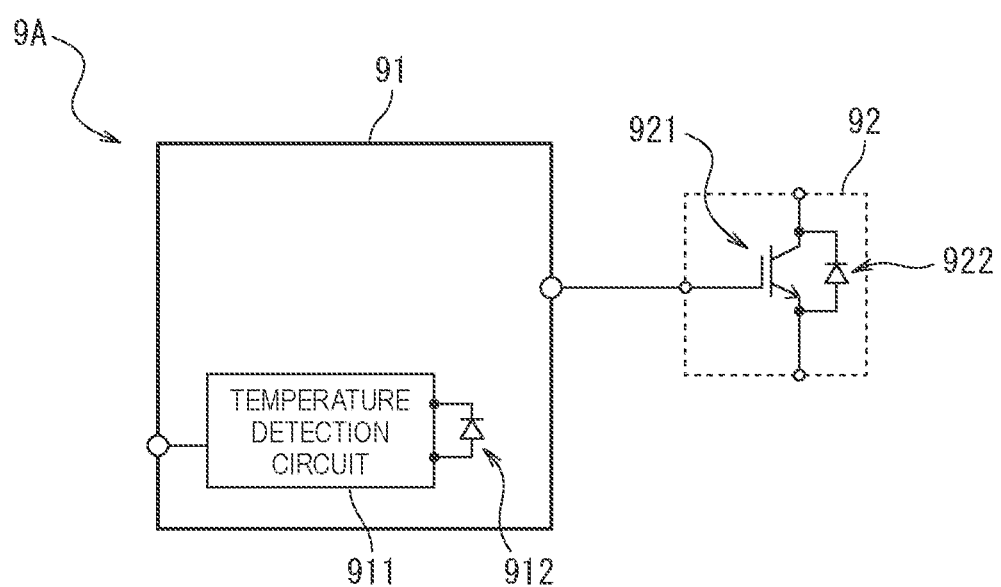
FIG. 4 is a diagram illustrating a temperature detection circuit provided in a power converter as Comparative Example 1.
Figure 5:
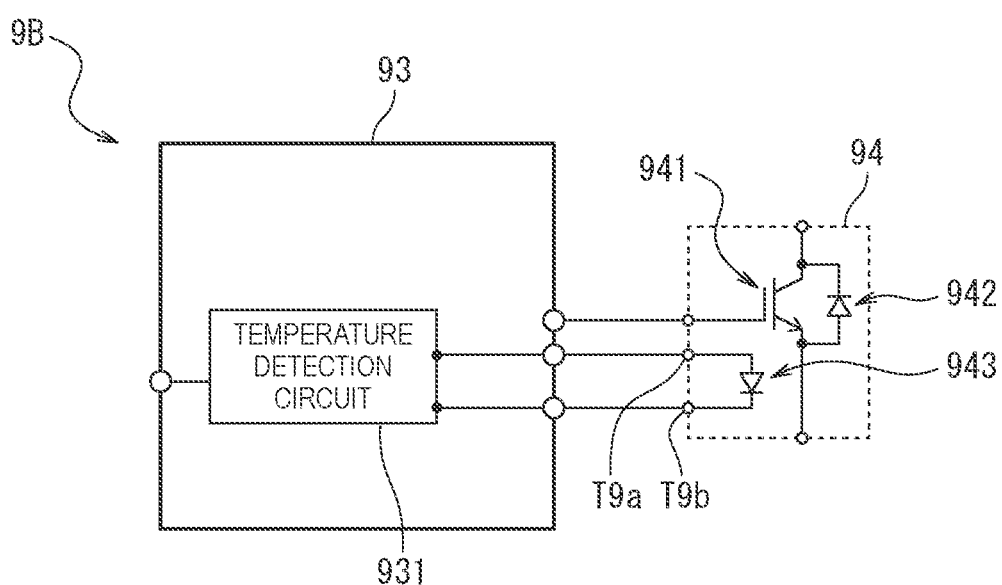
FIG. 5 is a diagram illustrating a temperature detection circuit provided in a power converter as Comparative Example 2.

The effects of the power converter according to this embodiment are described using FIG. 4 and FIG. 5 with reference to FIG. 1. FIG. 4 is a diagram illustrating an example of principal parts of a power converter as Comparative Example 1. FIG. 5 is a diagram illustrating an example of principal parts of a power converter as Comparative Example 2.

As illustrated in FIG. 4, a gate drive circuit 91 provided in a power converter 9A as Comparative Example 1 has a temperature detection circuit 911 and a temperature detection diode 912 connected to the temperature detection circuit 911. The power converter 9A further has a semiconductor element 92 including an IGBT 921 driven by the gate drive circuit 91. The semiconductor element 92 has a reflux diode 922 connected in anti-parallel to the IGBT 921.

In the power converter 9A, the temperature detection diode 912 and the IGBT 921 are arranged apart from each other. Therefore, a thermal gradient of 10° C. or higher, for example, is generated between the temperature detection diode 912 and the IGBT 921. Therefore, in the power converter 9A, the temperature detection of the temperature detection diode 912 cannot follow a sudden temperature rise occurring in the switching operation of the IGBT 921. Further, the temperature detection diode 912 cannot follow a temperature rise in the transition of the switching operation of the IGBT 921. Therefore, the power converter 9A has a problem of damaging the IGBT 921 because the temperature detection circuit 911 provided in the gate drive circuit 91 cannot detect a sudden temperature rise or the like caused by the flow of an overcurrent to the IGBT 921.

On the other hand, the power converter 1A according to this embodiment includes the semiconductor elements 21u, 21v, 21w in which the IGBT 211 and the temperature detection resistor element 213 are integrated into one chip as illustrated in FIG. 1. Therefore, the temperature detection resistor element 213 and the IGBT 211 are arranged close to each other, so that the thermal gradient is hardly generated between the temperature detection resistor element 213 and the IGBT 211. This enables the temperature detection resistor element 213 to detect the temperature following the sudden temperature rise occurring in the switching operation of the IGBT 211 and the temperature rise in the transition of the switching operation of the IGBT 211. As a result, the power converter 1A can prevent damage to the IGBTs 211 due to exceeding the rated temperature.

As illustrated in FIG. 5, a power converter 9B as Comparative Example 2 has a gate drive circuit 93 having a temperature detection circuit 931 and a semiconductor element 94 having an IGBT 941, a reflux diode 942, and a temperature detection diode 943. The IGBT 941, the reflux diode 942, and the temperature detection diode 943 are integrated into one chip. The reflux diode 942 is connected in anti-parallel to the IGBT 941.

The semiconductor element 94 has a terminal T9a connected to an anode of the temperature detection diode 943 and a terminal T9b connected to a cathode of the temperature detection diode 943. The temperature detection diode 943 is connected to the temperature detection circuit 931 provided in the gate drive circuit 93 via the terminals T9a, T9b. Therefore, the power converter 9B needs to be provided with the terminals T9a, T9b, and thus has a problem that the semiconductor element 94 is upsized. Further, the power converter 9B needs to be provided with terminals for connecting the temperature detection diode 943 in the gate drive circuit 93, and thus has a problem that the number of terminals in the gate drive circuit 93 increases.

On the other hand, in the power converter 1A, the temperature detection resistor element 213 is arranged between the gate G and the emitter E of the IGBT 211 as illustrated in FIG. 1. Therefore, in the power converter 1A, the semiconductor elements 21u, 21v, 21w can be connected to the gate drive circuit 23 by the gate terminals Tg without the need for terminals for the temperature detection resistor elements 213. This enables the power converter 1A to prevent upsizing of the semiconductor elements 21u, 21v, 21w and an increase in the number of terminals of the gate drive circuit 22.

As described above, the power converter 1A according to this embodiment includes the IGBTs 211 connected between the IGBTs 201 connected to the positive electrode side of the variable power supply 4 and the negative electrode side of the variable power supply 4, the temperature detection resistor elements 213 connected to the gates G to which the gate signals SgUL, SgVL, SgWL for controlling the switching operations of the IGBTs 211 are input and detecting the temperatures of the IGBTs 211, and the U-phase detection unit 234U, the V-phase detection unit 234V, and the W-phase detection unit 234W detecting the temperature levels of the IGBTs 211 based on the voltages of the gates G.

This enables the power converter 1A to prevent upsizing of chips on which the IGBTs 211 are formed and to detect the temperatures in the switching operations of the IGBTs 211.

Second Embodiment

Figure 6:
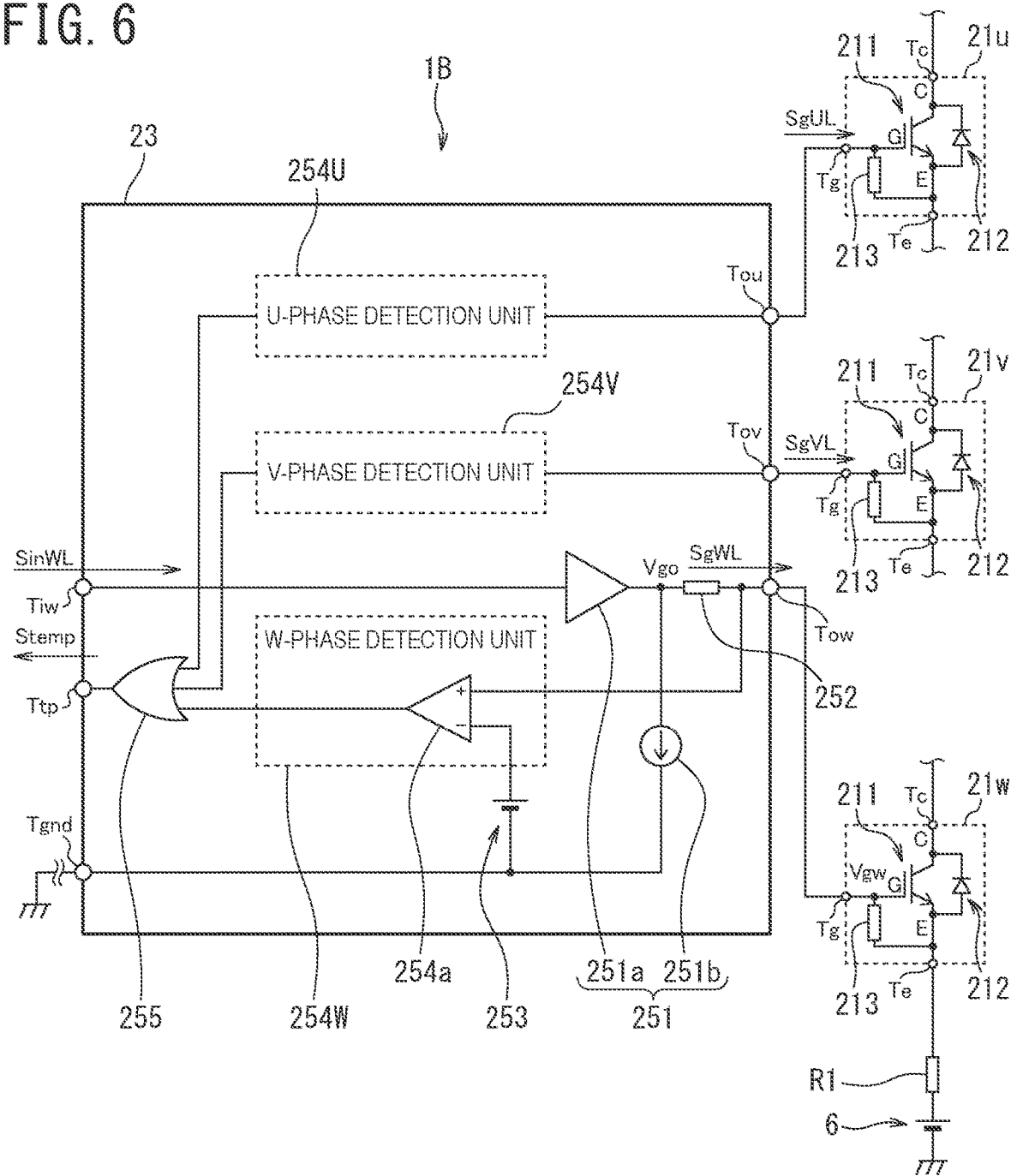
FIG. 6 is a diagram illustrating an example of a temperature detection circuit provided in a power converter according to a second embodiment of the present invention.

A power converter according to a second embodiment of the present invention is described using FIG. 6. A power converter 1B according to this embodiment has a feature that the configuration of a temperature detection unit detecting the temperature levels of the IGBTs is different from the configuration of the power converter 1A according to the above-described first embodiment. In the description of the power converter 1B according to this embodiment, constituent components having the same operations and functions as those of the constituent components of the power converter 1A according to the above-described first embodiment are given with the same reference numerals and a description thereof is omitted.
(Configuration of Power Converter)

The power converter 1B according to this embodiment has a configuration similar to the configuration of the power converter 1A according to the above-described first embodiment except for a difference in the configurations of a U-phase detection unit, a V-phase detection unit, and a W-phase detection unit provided in a gate drive circuit. Therefore, the illustration of the overall configuration of the power converter 1B is omitted.
(Configuration and Operation of Detection Unit Provided in Power Converter)

Next, the configuration and the operation of a temperature detection unit provided in the power converter 1B according to this embodiment are described using FIG. 6 with reference to FIG. 1 and FIG. 3.

As illustrated in FIG. 6, the power converter 1B includes the IGBTs 211 connected between the IGBTs 201 (see FIG. 1) connected to the positive electrode side of the variable power supply 4 (see FIG. 1) and the negative electrode side of the variable power supply 4, temperature detection resistor elements (one example of the temperature detection element) 213 connected to the gates G to which the gate signals SgUL, SgVL, SgWL for controlling the switching operations of the IGBTs 211 are input and detecting the temperatures of the IGBTs 211, and a U-phase detection unit 254U, a V-phase detection unit 254V, and a W-phase detection unit 254W (all are examples of the detection unit) detecting the temperature levels of the IGBTs 211 based on the voltages of the gates G.

The configuration and the operation of the U-phase detection unit 254U, the V-phase detection unit 254V, and the W-phase detection unit 254W provided in the power converter 1B are described using FIG. 6 with reference to FIG. 1. The U-phase detection unit 254U, the V-phase detection unit 254V, and the W-phase detection unit 254W have similar configurations. Therefore, the U-phase detection unit 254U, the V-phase detection unit 254V, and the W-phase detection unit 254W are described below taking the W-phase detection unit 254W as an example. For ease of understanding, FIG. 6 illustrates the semiconductor elements 21u, 21v, 21w and a driver circuit 251 driving the semiconductor element 21w. Further, for ease of understanding, FIG. 6 illustrates the U-phase detection unit 254U and the V-phase detection unit 254V (specific circuit configurations are not illustrated) and terminals relating to the detection of the temperature levels of the IGBTs 211.

As illustrated in FIG. 6, the gate drive circuit 23 has the driver circuit 251 to which the input signal SinWL output from the control device 3 (see FIG. 1) is input and a gate resistor 252 arranged between the driver circuit 251 and the output terminal Tow of the gate drive circuit 23. The driver circuit 251 has a driver unit 251a connected to the input terminal Tiw of the gate drive circuit 23 and a constant current source 251b. An input terminal of the driver unit 251a is connected to the input terminal Tiw and an output terminal of the driver unit 251a is connected to the constant current source 251b and one terminal of the gate resistor 252. The gate resistor 252 is provided to suppress a voltage fluctuation occurring in the switching operation of the IGBT 211 provided in the semiconductor element 21w. The driver unit 251a is configured to output the gate signal SgVL of a high level when the voltage level of the input terminal Tiw is low and output the gate signal SgVL of a low level when the voltage level of the input terminal Tiw is high.

When the IGBT 211 provided in the semiconductor element 21w is transited from the off state to the on state, the constant current source 251b outputs a predetermined gate current to the gate terminal Tg of the semiconductor element 21w via the gate resistor 252 and the output terminal Tow. Thus, the driver circuit 251 outputs the gate signal SgWL having a high voltage level to the gate G of the IGBT 211 provided in the semiconductor element 21w via the gate resistor 252, the output terminal Tow, and the gate terminal Tg of the semiconductor element 21w. Therefore, the gate signal SgWL applied to the gate G of the IGBT 211 provided in the semiconductor element 21w has a voltage lower by the voltage drop at the gate resistor 252 than the voltage of the gate signal SgWL output by the driver circuit 251.

On the other hand, when the IGBT 211 provided in the semiconductor element 21w is transited from the on state to the off state, the constant current source 251b does not output the gate current but releases an electric charge charged to the gate capacitance (not illustrated) of the IGBT 211 provided in the semiconductor element 21w to the reference potential terminal Tgnd. Thus, the driver circuit 251 drives the IGBT 211 such that the voltage Vgw of the gate G of the IGBT 211 provided in the semiconductor element 21w is lowered to almost the same level as the level of the voltage of the gate signal SgWL of a low level.

As described above, the driver circuit 251 transits the state of the IGBT 211 provided in the semiconductor element 21w from the off state (non-conduction state) to the on state (conduction state) (i.e., turn on) when the voltage level of the input signal SinWL input from the input terminal Tiw is low. On the other hand, the driver circuit 251 transits the state of the IGBT 211 provided in the semiconductor element 21w from the on state (conduction state) to the off state (non-conduction state) (i.e., turn off) when the voltage level of the input signal SinWL input from the input terminal Tiw is high.

Although not illustrated, the gate drive circuit 23 has a driver circuit having a configuration similar to the configuration of the driver circuit 251 and driving the IGBT 211 provided in the semiconductor element 21u and a driver circuit having a configuration similar to the configuration of the driver circuit 251 and driving the IGBT 211 provided in the semiconductor element 21v. Although not illustrated, the gate drive circuit 23 has a gate resistor provided between the driver circuit and the output terminal Tou and a gate resistor provided between the driver circuit and the output terminal Tov. The gate drive circuit 22 (see FIG. 1) further has a driver circuit having a configuration similar to the configuration of the driver circuit 251 and driving the IGBT 201 provided in each of the semiconductor elements 20u, 20v, 20w and a gate resistor provided between each of the driver circuits and each of the output terminals Tou, Tov, Tow in each of the semiconductor elements 20u, 20v, 20w, respectively.

As illustrated in FIG. 6, the gate drive circuit 23 has the W-phase detection unit 254W detecting the temperature level of the IGBT 211 based on the voltage of the gate G of the IGBT 211 provided in the semiconductor element 21w. Thus, the W-phase detection unit 254W is provided in the gate drive circuit 23. In addition to the W-phase detection unit 254W, the U-phase detection unit 254U and the V-phase detection unit 254V are also provided in the gate drive circuit 23. The formation of the U-phase detection unit 254U, the V-phase detection unit 254V, and the W-phase detection unit 254W in a semiconductor chip on which the gate drive circuit 23 is formed enables downsizing of the power converter 1B. The gate drive circuit 23 further has a voltage generation unit 253 generating a voltage for a comparison with the voltage of the gate G of the IGBT 211 provided in the semiconductor element 21w.

The W-phase detection unit 254W has a comparator 254a connected to the gate G of the IGBT 211 provided in the semiconductor element 21w and the voltage generation unit 253.

The voltage generation unit 253 contains, for example, a constant voltage source. The negative electrode side of the voltage generation unit 253 is connected to the reference potential terminal Tgnd provided in the gate drive circuit 23. The voltage generation unit 253 is configured to generate a comparison voltage Vref serving as the reference for the comparison in the comparator 254a. The comparison voltage Vref is set such that an overheat threshold level that the IGBT 211 provided in the semiconductor element 21w can cope with is detectable. For example, the comparison voltage Vref is set to a voltage higher than the gate-emitter voltage Vge when the IGBT 211 provided in the semiconductor element 21w is operating within the range of the rated temperature.

The comparator 254a has a configuration similar to the configuration of the comparator 234a (see FIG. 2) in the above-described first embodiment, for example. A non-inverting input terminal (+) of the comparator 254a is connected to the other terminal of the gate resistor 252 and the output terminal Tow. The output terminal Tow is connected to the gate G of the IGBT 211 via the gate terminal Tg of the semiconductor element 21w. Therefore, the non-inverting input terminal (+) of the comparator 254a is connected to the gate G of the IGBT 211 provided in the semiconductor element 21w. An inverting input terminal (−) of the comparator 254a is connected to the positive electrode side of the voltage generation unit 253. An output terminal of the comparator 254a is connected to an input terminal of a logical sum (OR) gate 255 (details are described later).

When the voltage Vgw of the gate G of the IGBT 211 provided in the semiconductor element 21w is equal to or smaller than the comparison voltage Vref generated by the voltage generation unit 253 (i.e., equal to or lower than the comparison voltage Vref), the comparator 254a outputs an output signal having a low voltage level as a detection signal for the temperature level of the IGBT 211 provided in the semiconductor element 21w to the OR gate 255. When the voltage Vgw of the gate G of the IGBT 211 is higher than the comparison voltage Vref, the comparator 254a outputs an output signal having a high voltage level as a detection signal for the temperature level of the IGBT 211 provided in the semiconductor element 21w to the OR gate 255.

The principle of the temperature detection of the IGBTs 211 in the U-phase detection unit 254U, the V-phase detection unit 254V, and the W-phase detection unit 254W is similar to the principle of the temperature detection in the U-phase detection unit 234U, the V-phase detection unit 234V, and the W-phase detection unit 234W in the above-described first embodiment, and therefore a description is omitted.

As illustrated in FIG. 6, the gate drive circuit 23 has the OR gate 255 arranged between the output terminal of each of the U-phase detection unit 254U, the V-phase detection unit 254V, and the W-phase detection unit 254W and the detection signal output terminal Ttp. One of three input terminals of the OR gate 255 is connected to the output terminal of the U-phase detection unit 254U. One of the remaining input terminals of the OR gate 255 is connected to the output terminal of the V-phase detection unit 254V and the other one of the remaining input terminals is connected to the output terminal of the W-phase detection unit 254W. An output terminal of the OR gate 255 is connected to the detection signal output terminal Ttp.

The OR gate 255 outputs a signal obtained by ORing the output signals output from the U-phase detection unit 254U, the V-phase detection unit 254V, and the W-phase detection unit 254W as the temperature detection signal Stemp.

When the IGBT 211 provided in each of the semiconductor elements 21u, 21v, 21w performs the turn-on operation or maintains the on state within the range of the rated temperature, output signals having a low voltage level are input into the OR gate 255 from the U-phase detection unit 254U, the V-phase detection unit 254V, and the W-phase detection unit 254W. In this case, the OR gate 255 outputs the temperature detection signal Stemp having a low voltage level to the control device 3 (see FIG. 1).

On the other hand, when at least one of the IGBTs 211 provided in the semiconductor elements 21u, 21v, 21w performs the turn-on operation or maintains the on state at a temperature higher than the rated temperature, output signals having a high voltage level are input into the OR gate 255 from the detection unit detecting the temperature level of the at least one of the IGBTs 211 of the U-phase detection unit 254U, the V-phase detection unit 254V, and the W-phase detection unit 254W. In this case, the OR gate 255 outputs the temperature detection signal Stemp having a high voltage level to the control device 3.

When the IGBT 211 provided in each of the semiconductor elements 21u, 21v, 21w performs the turn-off operation or is in the off state, output signals having a low voltage level are input into the OR gate 255 from the U-phase detection unit 254U, the V-phase detection unit 254V, and the W-phase detection unit 254W. In this case, the OR gate 255 outputs the temperature detection signal Stemp having a low voltage level to the control device 3 (see FIG. 1).

As described above, the gate drive circuit 23 in this embodiment can detect that any of the IGBTs 211 provided in the semiconductor elements 21u, 21v, 21w has a temperature level higher than the temperature level of the rated temperature as with the gate drive circuit 23 in the above-described first embodiment. This enables the control device 3 in this embodiment to control the gate drive circuits 22, 23 as with the control device 3 in the above-described first embodiment, and therefore the overheat state of the IGBT 211 at a temperature level higher than the temperature level of the rated temperature is stopped. Therefore, the power converter 1B can prevent damage of the IGBT 211 at a temperature level higher than the temperature level of the rated temperature and damage due to, for example, an overcurrent in another IGBT 211 resulting from the damage of the IGBT 211.

As described above, the temperature detection resistor element 213 provided in the power converter 1B according to this embodiment exhibits a temperature detection function similar to that of the temperature detection resistor element 213 provided in the power converter 1A according to the above-described first embodiment in accordance with the temperature levels of the IGBTs 211. Further, the U-phase detection unit 254U, the V-phase detection unit 254V, and the W-phase detection unit 254W provided in the power converter 1B according to this embodiment exhibit a temperature detection function similar to that of the U-phase detection unit 234U, the V-phase detection unit 234V, and the W-phase detection unit 234W provided in the power converter 1A according to the above-described first embodiment in accordance with the temperature levels of the IGBTs 211. Therefore, the power converter 1B according to this embodiment obtains effects similar to the effects of the power converter 1A according to the above-described first embodiment.

The present invention is not limited to the embodiments described above and can be variously modified.

Although the power converters 1A, 1B according to the first embodiment and the second embodiment, respectively, described above have the IGBTs 201 as the first switching element and the IGBTs 211 as the second switching element, the present invention is not limited thereto. The power converters 1A, 1B may include either a bipolar transistor or a MOS transistor in place of the IGBT as the first switching element and the second switching element. The first switching element and the second switching element may be wide bandgap semiconductor elements containing SiC, GaN, diamond, gallium nitride-based materials, gallium oxide-based materials, AlN, AlGaN, ZnO, and the like.

In the first embodiment and the second embodiment described above, the semiconductor elements $20u$, $20v$, $20w$ constituting the upper arm part are driven by one gate drive circuit 22, but the present invention is not limited thereto. The power converters 1A, 1B may be configured to have three gate drive circuits and individually drive the semiconductor elements $20u$, $20v$, $20w$ constituting the upper arm part by these gate drive circuits.

The power converter 1A according to the above-described first embodiment may have the driver circuit 251 and the U-phase detection unit 254U, the V-phase detection unit 254V, and the W-phase detection unit 254W in the above-described second embodiment in place of the driver circuit 231 and the U-phase detection unit 234U, the V-phase detection unit 234V, and the W-phase detection unit 234W. The power converter 1B according to the above-described second embodiment may have the driver circuit 231 and the U-phase detection unit 234U, the V-phase detection unit 234V, and the W-phase detection unit 234W in the above-described first embodiment in place of the driver circuit 251 and the U-phase detection unit 254U, the V-phase detection 254V, and the W-phase detection unit 254W.

The technical scope of the present invention is not limited to the illustrated, described, and exemplified embodiments, and includes all embodiments that bring about the equivalent effects to the intended effects of the present invention. Moreover, the technical scope of the present invention is not limited to the combination of the features of the inventions set forth in appended claims, but can be defined by all desired combinations of particular features among all disclosed features.

REFERENCE SIGNS LIST 1A, 1B power converter
2 inverter device
2U U-phase output arm
2V V-phase output arm
2W W-phase output arm
3 control device
4 variable power supply
5 smoothing capacitor
6 constant voltage source
7 motor
$20u$, $20v$, $20w$, $21u$, $21v$, $21w$ semiconductor element
22, 23 gate drive circuit
201 insulated gate bipolar transistor (IGBT)
202, 212 reflux diode
211 insulated gate bipolar transistor (IGBT)
213 temperature detection resistor element
231, 251 driver circuit
231$a$, 251$a$ driver unit
231$b$, 251$b$ constant current source
232, 252 gate resistor
233, 253 voltage generation unit
234$a$, 254$a$ comparator
234$b$ AND gate
234U, 254U U-phase detection unit
234V, 254V V-phase detection unit
234W, 254W W-phase detection unit
235, 255 OR gate
C collector
Cu capacitor
D diode
E emitter
G gate
Ln negative electrode side line
Lp positive electrode side line
R1, R2, R3 resistor element
SgUH, SgUL, SgVH, SgVL, SgWH, SgWL gate signal
SinUH, SinUL, SinVH, SinVL, SinWH, SinWL input signal
Stemp temperature detection signal
TBu U-phase power supply terminal
Tc collector terminal
Tcc, Tdu power supply terminal
TccH, TccL control power supply terminal
Tcom common reference potential terminal
Te emitter terminal
Tg gate terminal
Tgnd reference potential terminal
TIS overcurrent detection input terminal
Tiu, Tiv, Tiw input terminal
Tiuh, Tiul, Tivh, Tivl, Tiwh, Tiwl signal input terminal
Tnu U-phase main power supply input terminal
Tnv V-phase main power supply input terminal
Tnw W-phase main power supply input terminal
Tou, Tov, Tow output terminal
Tp main power supply input terminal
Ts detection terminal
Tsu, Tsv, Tsw low potential terminal
Ttemp temperature output terminal
Ttp detection signal output terminal
TU U-phase output terminal
TV V-phase output terminal
TW W-phase output terminal

What is claimed is:

1. A power converter comprising:
a second switching element connected between a first switching element connected to a positive electrode side of a power supply and a negative electrode side of the power supply;
a temperature detection element connected to a control signal input terminal to which a control signal for controlling a switching operation of the second switching element is input and configured to detect a temperature of the second switching element; and
a detection unit configured to detect a temperature level of the second switching element based on a voltage of the control signal input terminal, wherein
the detection unit is configured to detect the temperature level based on a level of the voltage of the control signal input terminal with respect to a comparison voltage input from an outside.

2. The power converter according to claim 1, wherein
the second switching element and the temperature detection element are formed on a same semiconductor chip.

3. The power converter according to claim 2, wherein
the second switching element is an insulated gate bipolar transistor having a gate as the control signal input terminal.

4. The power converter according to claim 2 comprising:
a drive circuit configured to output the control signal to the control signal input terminal and drive the second switching element, wherein
the detection unit is provided in the drive circuit.

5. The power converter according to claim 1, wherein
the second switching element is an insulated gate bipolar transistor having a gate as the control signal input terminal.

6. The power converter according to claim 5, wherein
the temperature detection element is a resistor element having one terminal connected to the gate and another terminal connected to an emitter of the insulated gate bipolar transistor.

7. The power converter according to claim 6 comprising:
a drive circuit configured to output the control signal to the control signal input terminal and drive the second switching element, wherein
the detection unit is provided in the drive circuit.

8. The power converter according to claim 5 comprising:
a drive circuit configured to output the control signal to the control signal input terminal and drive the second switching element, wherein
the detection unit is provided in the drive circuit.

9. The power converter according to claim 1 comprising:
a drive circuit configured to output the control signal to the control signal input terminal and drive the second switching element, wherein
the detection unit is provided in the drive circuit.

* * * * *